United States Patent
Cha et al.

(10) Patent No.: US 12,272,765 B2
(45) Date of Patent: Apr. 8, 2025

(54) HIGH EFFICIENCY LIGHT EMITTING DEVICE, UNIT PIXEL HAVING THE SAME, AND DISPLAYING APPARATUS HAVING THE SAME

(71) Applicant: SEOUL VIOSYS CO., LTD., Gyeonggi-do (KR)

(72) Inventors: Namgoo Cha, Gyeonggi-do (KR); Sangmin Kim, Gyeonggi-do (KR); Yeonkyu Park, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 248 days.

(21) Appl. No.: 17/473,548

(22) Filed: Sep. 13, 2021

(65) Prior Publication Data

US 2022/0093825 A1 Mar. 24, 2022

Related U.S. Application Data

(60) Provisional application No. 63/082,562, filed on Sep. 24, 2020.

(51) Int. Cl.
*H01L 33/10* (2010.01)
*H01L 25/075* (2006.01)
(Continued)

(52) U.S. Cl.
CPC .......... *H01L 33/10* (2013.01); *H01L 25/0753* (2013.01); *H01L 33/405* (2013.01); *H01L 33/60* (2013.01); *H01L 33/62* (2013.01)

(58) Field of Classification Search
CPC ......... H01L 33/60; H01L 33/62; H01L 33/10; H01L 33/405
See application file for complete search history.

(56) References Cited

U.S. PATENT DOCUMENTS

2006/0175621 A1* 8/2006 Ohtsuka ................ H01L 27/156
　　　　　　　　　　　　　　　　　　　438/30
2014/0027709 A1* 1/2014 Higginson .............. H01L 33/62
　　　　　　　　　　　　　　　　　　　438/26
(Continued)

FOREIGN PATENT DOCUMENTS

KR　　1020130008478 A　　1/2013
KR　　1020150138977 A　　12/2015
(Continued)

OTHER PUBLICATIONS

International Search Report for corresponding International Application No. PCT/KR2021/012934, mailed Jan. 4, 2022, 3 pages.

*Primary Examiner* — Feifei Yeung Lopez
(74) *Attorney, Agent, or Firm* — LaBatt, LLC

(57) ABSTRACT

A light emitting device is a micro-scale light emitting device including a semiconductor stack, an insulation layer, and a metal reflection layer. The semiconductor stack includes a first conductivity type semiconductor layer, a second conductivity type semiconductor layer, and an active layer disposed between the first conductivity type semiconductor layer and the second conductivity type semiconductor layer. The insulation layer covers upper and side surfaces of the semiconductor stack. The metal reflection layer is disposed on the insulation layer, and covers at least a portion of the side surface of the semiconductor stack. The insulation layer includes a distributed Bragg reflector.

20 Claims, 10 Drawing Sheets

(51) Int. Cl.
    *H01L 33/40*    (2010.01)
    *H01L 33/60*    (2010.01)
    *H01L 33/62*    (2010.01)

(56) References Cited

U.S. PATENT DOCUMENTS

| | | | | |
|---|---|---|---|---|
| 2015/0034963 | A1* | 2/2015 | Kinouchi | H01L 33/46 |
| | | | | 257/76 |
| 2016/0293811 | A1* | 10/2016 | Hussell | H01L 27/156 |
| 2017/0033268 | A1* | 2/2017 | Lee | H01L 33/62 |
| 2018/0135809 | A1* | 5/2018 | Kim | H05K 1/189 |
| 2021/0028337 | A1* | 1/2021 | Yan | H01L 33/405 |
| 2022/0115563 | A1* | 4/2022 | He | H01L 33/0095 |

FOREIGN PATENT DOCUMENTS

| | | | |
|---|---|---|---|
| KR | 1020160141362 | A | 12/2016 |
| KR | 1020170007117 | A | 1/2017 |
| KR | 1020180081378 | A | 7/2018 |
| WO | 2019066339 | A1 | 4/2019 |
| WO | WO2021/087686 | * | 5/2021 |

* cited by examiner

HIGH EFFICIENCY LIGHT EMITTING DEVICE, UNIT PIXEL HAVING THE SAME, AND DISPLAYING APPARATUS HAVING THE SAME

CROSS-REFERENCE OF RELATED APPLICATIONS AND PRIORITY

This application is a Nonprovisional application which claims priority to and benefit of U.S. Provisional Application No. 63/082,562, filed Sep. 24, 2020, which is hereby incorporated by reference for all purposes as if fully set forth herein.

TECHNICAL FIELD

Exemplary embodiments relate to a micro LED displaying apparatus, and more particularly, to a high efficiency light emitting device, a unit pixel having the same, and a displaying apparatus having the same.

BACKGROUND

Light emitting devices are semiconductor devices using light emitting diodes which are inorganic light sources, and are used in various technical fields such as displaying apparatuses, automobile lamps, general lighting, and the like. Light emitting diodes have advantages such as longer lifespan, lower power consumption, and quicker response, than conventional light sources, and thus, the light emitting diodes have been replacing the conventional light sources.

The conventional light emitting diodes have been generally used as backlight light sources in displaying apparatuses. However, displaying apparatuses that directly realize images using the light emitting diodes have been recently developed. Such displays are also referred to as micro LED displays.

SUMMARY

In general, the displaying apparatus displays various colors through mixture of blue, green, and red light. In order to realize various images, the displaying apparatus includes a plurality of pixels, each including sub-pixels corresponding to one of blue, green, and red light. As such, a color of a certain pixel is typically determined based on the colors of the sub-pixels, so that images can be realized through the combination of such pixels.

In the case of the micro LED display, a micro LED is arranged on a two-dimensional plane corresponding to each sub pixel, and, accordingly, a large number of micro LEDs need to be arranged on a single substrate. However, the micro LED is extremely small, for example, 200 µm or less, further 100 µm or less. It is difficult to handle the light emitting diodes having small sizes, such as directly mounting the light emitting diodes on a display panel.

Meanwhile, if some portion of light generated in the micro LED may not be emitted to the outside but lost, light efficiency of the micro LED may become relatively low. Therefore, exemplary embodiments provide a micro-scale light emitting device with improved light efficiency.

Exemplary embodiments provide a method of manufacturing a light emitting module in which a unit pixel employing high efficiency light emitting devices, and/or a transparent molding member are easily implemented, and suitable for mass production.

An exemplary embodiment provides a micro-scale light emitting device includes a semiconductor stack including a first conductivity type semiconductor layer, a second conductivity type semiconductor layer, and an active layer disposed between the first conductivity type semiconductor layer and the second conductivity type semiconductor layer, an insulation layer covering upper and side surfaces of the semiconductor stack, and a metal reflection layer disposed on the insulation layer, and covering at least a portion of the side surface of the semiconductor stack, in which the insulation layer includes a distributed Bragg reflector.

An exemplary embodiment provides a micro-scale light emitting device includes a semiconductor stack including a first conductivity type semiconductor layer, a second conductivity type semiconductor layer, and an active layer disposed between the first conductivity type semiconductor layer and the second conductivity type semiconductor layer, an insulation layer covering upper and side surfaces of the semiconductor stack, and a metal reflection layer disposed on the insulation layer, and covering at least a portion of the side surface of the semiconductor stack, in which the insulation layer disposed on the upper surface of the semiconductor stack is thicker than the insulation layer disposed on the side surface of the semiconductor stack.

An exemplary embodiment provides a unit pixel including a transparent substrate, a light blocking layer disposed on the transparent substrate and having windows that transmit light, and a plurality of light emitting devices disposed on the light blocking layer to be arranged with the windows, each of the light emitting devices including a semiconductor stack including a first conductivity type semiconductor layer, a second conductivity type semiconductor layer, and an active layer disposed between the first conductivity type semiconductor layer and the second conductivity type semiconductor layer, an insulation layer covering upper and side surfaces of the semiconductor stack, and a metal reflection layer disposed on the insulation layer, and covering at least a portion of the side surface of the semiconductor stack, in which the insulation layer includes a distributed Bragg reflector.

An exemplary embodiment provides a displaying apparatus include a circuit board, unit pixels mounted on the circuit board, and a molding member covering the unit pixels. The unit pixels include a transparent substrate and a plurality of light emitting devices disposed on the transparent substrate. Each of the light emitting devices includes a semiconductor stack including a first conductivity type semiconductor layer, a second conductivity type semiconductor layer, and an active layer disposed between the first conductivity type semiconductor layer and the second conductivity type semiconductor layer, an insulation layer covering upper and side surfaces of the semiconductor stack, and a metal reflection layer disposed on the insulation layer, and covering at least a portion of the side surface of the semiconductor stack, in which the insulation layer includes a distributed Bragg reflector. According to one or more embodiments of the present disclosure, a micro-scale light emitting device includes a semiconductor stack including a first conductivity type semiconductor layer, a second conductivity type semiconductor layer, and an active layer disposed between the first conductivity type semiconductor layer and the second conductivity type semiconductor layer. The first conductivity type semiconductor layer, the active layer and the second conductivity type semiconductor layer are laminated in a first direction. The micro-scale light emitting device further includes an insulation layer and a metal reflection layer disposed on the insulation layer. The insulation layer extends in a second direction perpendicular to the first direction and covering an upper surface and one or more side surfaces of the semiconductor stack. The upper surface is adjacent to the second conductivity type semiconductor layer in the first direction and the one or more side surfaces extend in the first direction toward the first conductivity type semiconductor layer. The metal reflection layer covers at least a portion of a side surface of the semiconductor stack. The insulation layer includes a distributed Bragg reflector. The micro-scale light emitting device is a sub-pixel of a unit pixel.

In at least one variant, the semiconductor stack further includes a mesa disposed on the first conductivity type semiconductor layer. The mesa includes the active layer and the second conductivity type semiconductor layer. A portion of the first electrode pad is extended to an upper region of the mesa. The second electrode pad is located on the mesa.

According to one or more embodiments of the present disclosure, a micro-scale light emitting device includes a semiconductor stack including a first conductivity type semiconductor layer, an active layer disposed on the first conductivity type semiconductor layer, and a second conductivity type semiconductor layer disposed on the active layer. The semiconductor stack further including a first surface and one or more second surfaces extending from the first surface and disposed at opposite ends. The micro-scale light emitting device further includes an insulation layer covering the first surface and the one or more second surfaces of the semiconductor stack; and a metal reflection layer disposed on the insulation layer, and covering at least a portion of the one or more the second surfaces of the semiconductor stack. The insulation layer disposed on the first surface of the semiconductor stack is thicker than the insulation layer disposed on the at least the portion of the one or more second surfaces of the semiconductor stack. The micro-scale light emitting device is a sub-pixel of a unit pixel.

In at least one variant, the metal reflection layer covers the one or more second surfaces of the semiconductor stack in their entirety, along side surfaces of the micro-scale light emitting device.

According to one or more embodiments of the present disclosure, a unit pixel includes a transparent substrate, a light blocking layer disposed on the transparent substrate and having windows that transmit light, and a plurality of light emitting devices disposed on the light blocking layer to be arranged with the windows. Each of the light emitting devices is structured to be a sub-pixel of the unit pixel and configured to be micro-scale. Each light emitting device includes a semiconductor stack including a first conductivity type semiconductor layer, a second conductivity type semiconductor layer, and an active layer disposed between the first conductivity type semiconductor layer and the second conductivity type semiconductor layer. The first conductivity type semiconductor layer, the active layer and the second conductivity type semiconductor layer are laminated in a first direction. The unit pixel further includes an insulation layer extending in a second direction perpendicular to the first direction and covering an upper surface and one or more side surfaces of the semiconductor stack and a metal reflection layer disposed on the insulation layer. The upper surface is adjacent to the second conductivity type semiconductor layer in the first direction and the one or more side surfaces extend in the first direction toward the first conductivity type semiconductor layer. The metal reflection layer covers at least a portion of a side surface of the semiconductor stack. The insulation layer includes a distributed Bragg reflector.

DETAILED DESCRIPTION OF THE ILLUSTRATED EMBODIMENTS

Figure 1A:
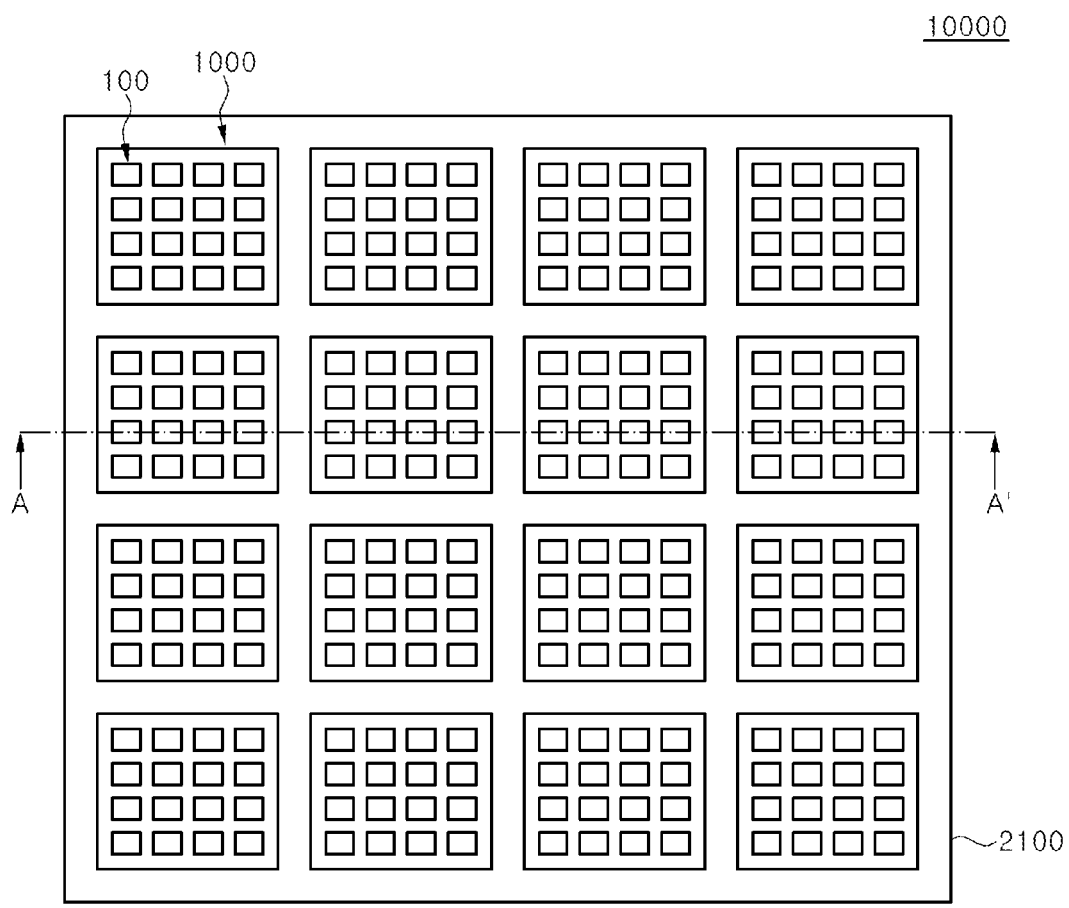
FIG. 1A is a schematic plan view illustrating a displaying apparatus according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

A light emitting device according to an exemplary embodiment is a micro-scale light emitting device, the light emitting device including: a semiconductor stack including a first conductivity type semiconductor layer, a second conductivity type semiconductor layer, and an active layer disposed between the first conductivity type semiconductor layer and the second conductivity type semiconductor layer; an insulation layer covering upper and side surfaces of the semiconductor stack; and a metal reflection layer disposed on the insulation layer, and covering at least a portion of the side surface of the semiconductor stack, in which the insulation layer includes a distributed Bragg reflector.

In the present disclosure, the micro-scale light emitting device has a size generally used for a micro LED display. The micro-scale light emitting device may have, for example, a major axis length of about 200 μm or less, further about 100 μm or less.

A thickness of the insulation layer covering the upper surface of the semiconductor stack may be greater than that of the insulation layer covering the side surface of the semiconductor stack.

The insulation layer covering the upper surface of the semiconductor stack may have a reflectance higher than that of the insulation layer covering the side surface of the semiconductor stack.

The metal reflection layer may include a first metal reflection layer and a second metal reflection layer spaced apart from each other, and the first and second metal reflection layers may partially cover the side surface of the semiconductor stack, respectively.

The light emitting device may further include a first electrode pad and a second electrode pad disposed on the insulation layer, and electrically connected to the first conductivity type semiconductor layer and the second conductivity type semiconductor layer, respectively, in which the first metal reflection layer may cover the first electrode pad, and the second metal reflection layer may cover the second metal pad.

The light emitting device may further include a first electrode pad and a second electrode pad disposed on the insulation layer, and electrically connected to the first conductivity type semiconductor layer and the second conductivity type semiconductor layer, respectively.

In an exemplary embodiment, the metal reflection layer may be spaced apart from the first and second electrode pads.

The metal reflection layer may be arranged in a ring shape along a side surface of the light emitting device.

The metal reflection layer may cover the first electrode pad, and may be spaced apart from the second electrode pad.

The semiconductor stack may further include a mesa disposed on the first conductivity type semiconductor layer, in which the mesa may include the active layer and the second conductivity type semiconductor layer, a portion of the first electrode pad may be located on the mesa, and the second electrode pad may be located on the mesa.

The light emitting device may further include a first contact pad adjacent to the mesa and disposed on the first conductivity type semiconductor layer, and the first electrode pad may be electrically connected to the first contact pad through the insulation layer.

The light emitting device may further include: an ohmic contact layer disposed on the second conductivity type semiconductor layer; and a second contact pad disposed on the ohmic electrode layer, in which the second electrode pad may be electrically connected to the second contact pad through the insulation layer.

A light emitting device according to an exemplary embodiment is a micro-scale light emitting device includes a semiconductor stack including a first conductivity type semiconductor layer, a second conductivity type semiconductor layer, and an active layer disposed between the first conductivity type semiconductor layer and the second conductivity type semiconductor layer, an insulation layer covering upper and side surfaces of the semiconductor stack, and a metal reflection layer disposed on the insulation layer, and covering at least a portion of the side surface of the semiconductor stack. The insulation layer disposed on the upper surface of the semiconductor stack is thicker than the insulation layer disposed on the side surface of the semiconductor stack.

The insulation layer disposed on the upper surface of the semiconductor stack may have a reflectance higher than that of the insulation layer disposed on the side surface of the semiconductor stack.

The metal reflection layer may include a first metal reflection layer and a second metal reflection layer spaced apart from each other.

The light emitting device may further include: a first electrode pad electrically connected to the first conductivity type semiconductor layer; and a second electrode pad electrically connected to the second conductivity type semiconductor layer, in which the first metal reflection layer may cover the first electrode pad, and the second metal reflection layer may cover the second electrode pad.

The metal reflection layer may cover entire side surfaces along side surfaces of the light emitting device.

A unit pixel according to an exemplary embodiment includes a transparent substrate, a light blocking layer disposed on the transparent substrate and having windows that transmit light, and a plurality of light emitting devices disposed on the light blocking layer to be arranged with the windows. Each of the light emitting devices includes a semiconductor stack including a first conductivity type semiconductor layer, a second conductivity type semiconductor layer, and an active layer disposed between the first conductivity type semiconductor layer and the second conductivity type semiconductor layer, an insulation layer covering upper and side surfaces of the semiconductor stack, and a metal reflection layer disposed on the insulation layer, and covering at least a portion of the side surface of the semiconductor stack. The insulation layer includes a distributed Bragg reflector.

The metal reflection layer may include a first metal reflection layer and a second metal reflection layer spaced apart from each other.

A displaying apparatus according to an exemplary embodiment includes a circuit board; unit pixels mounted on the circuit board, and a molding member covering the unit pixels. The unit pixels includes a transparent substrate and a plurality of light emitting devices disposed on the transparent substrate. Each of the light emitting devices includes a semiconductor stack including a first conductivity type semiconductor layer, a second conductivity type semiconductor layer, and an active layer disposed between the first conductivity type semiconductor layer and the second conductivity type semiconductor layer, an insulation layer covering upper and side surfaces of the semiconductor stack, and a metal reflection layer disposed on the insulation layer, and covering at least a portion of the side surface of the semiconductor stack, in which the insulation layer includes a distributed Bragg reflector.

Figure 1B:
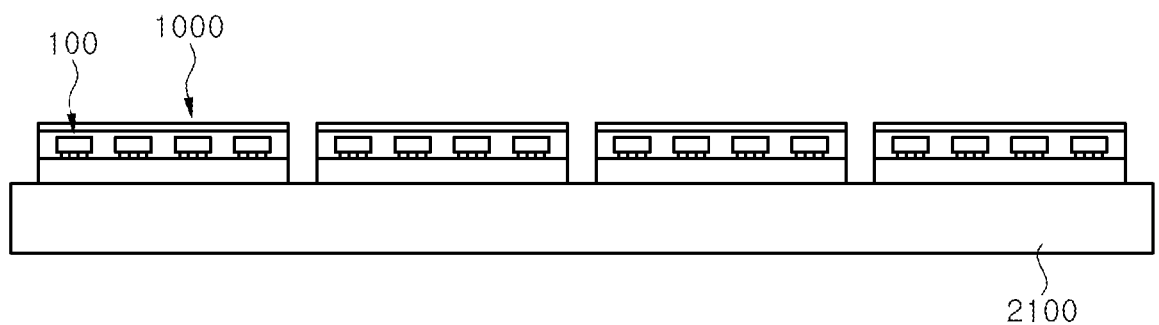
FIG. 1B is a schematic cross-sectional view taken along line A-A' of FIG. 1A.

Hereinafter, exemplary embodiments will be described in detail with reference to the accompanying drawings FIG. 1A is a schematic plan view illustrating a displaying apparatus according to an exemplary embodiment, and FIG. 1B is a schematic cross-sectional view taken along line A-A' of FIG. 1A.

Referring to FIGS. 1A and 1B, a displaying apparatus 10000 may include a panel substrate 2100 and a plurality of light emitting modules 1000.

The displaying apparatus 10000 is not particularly limited, but it may include a VR displaying apparatus such as a micro LED TV, a smart watch, a VR headset, or an AR displaying apparatus such as augmented reality glasses.

The panel substrate 2100 may include a circuit for a passive matrix driving or active matrix driving manner. In an exemplary embodiment, the panel substrate 2100 may include wirings and resistors therein, and, in another exemplary embodiment, the panel substrate 2100 may include wirings, transistors, and capacitors. The panel substrate 2100 may also have pads that are capable of being electrically connected to the disposed circuit on an upper surface thereof.

Figure 3A:
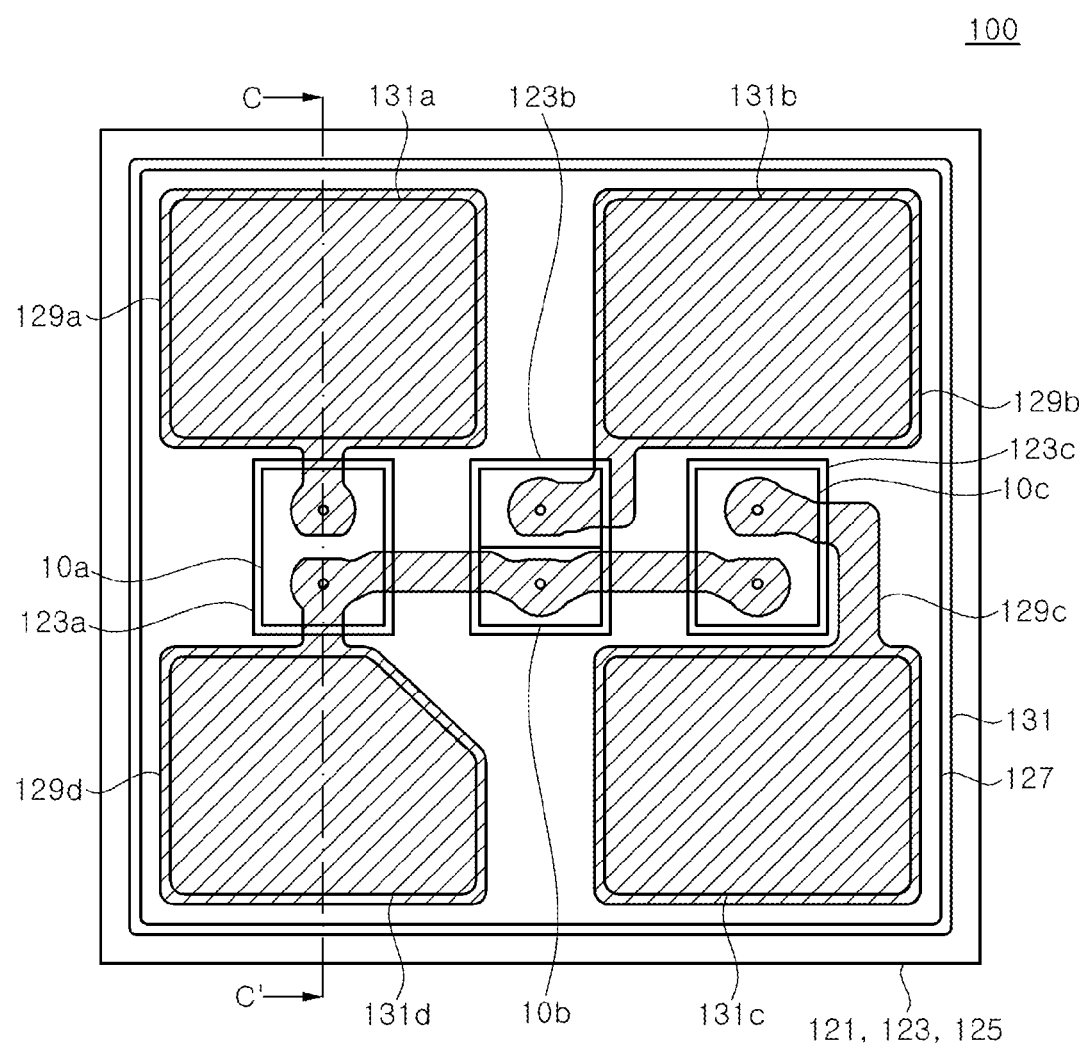
FIG. 3A is a schematic plan view illustrating a unit pixel according to an exemplary embodiment.

In an exemplary embodiment, the plurality of light emitting modules 1000 are arranged on the panel substrate 2100. Each of the light emitting modules 1000, as shown in FIG. 3A, may include a circuit board 1001 and a plurality of unit pixels 100 disposed on the circuit board 1001. Each of the unit pixels 100 includes a plurality of light emitting devices. The light emitting devices may emit light of different colors from one another.

Hereinafter, each element of the displaying apparatus 10000 will be described in detail in an order of the light emitting module 1000 disposed in the displaying apparatus 10000, the unit pixels 100 arranged in the light emitting module 1000, and the light emitting devices.

Figure 2A:
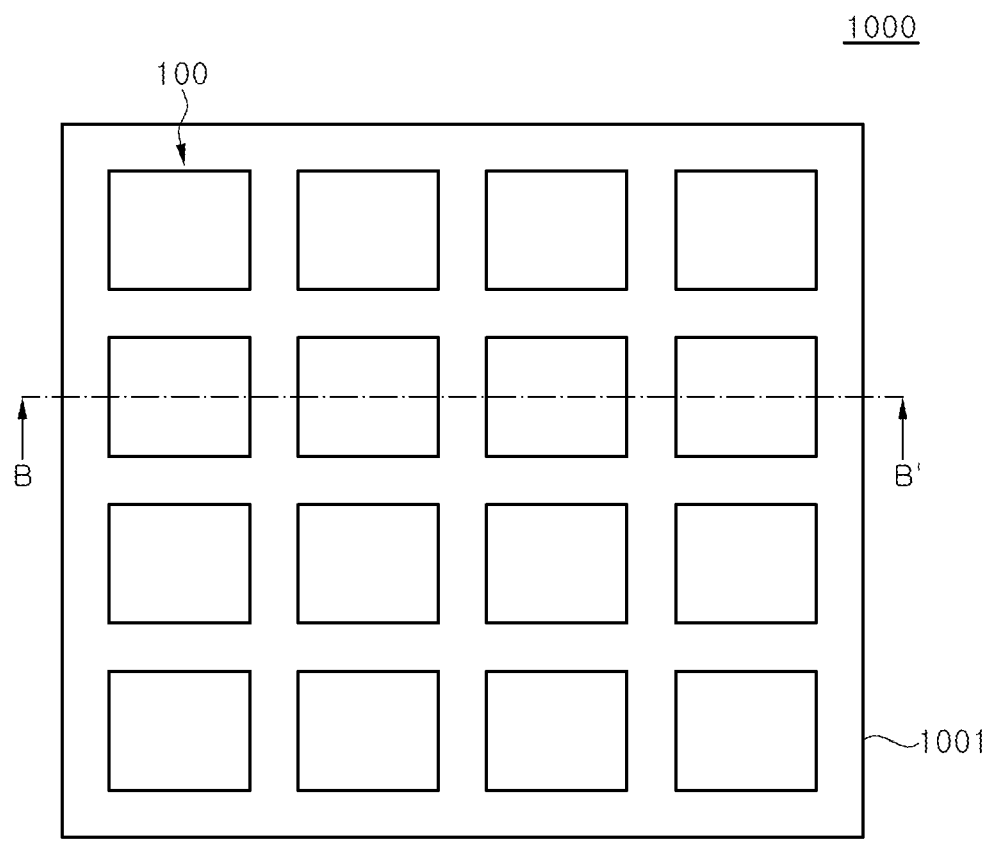
FIG. 2A is a schematic plan view illustrating a light emitting module according to an exemplary embodiment.
Figure 2B:
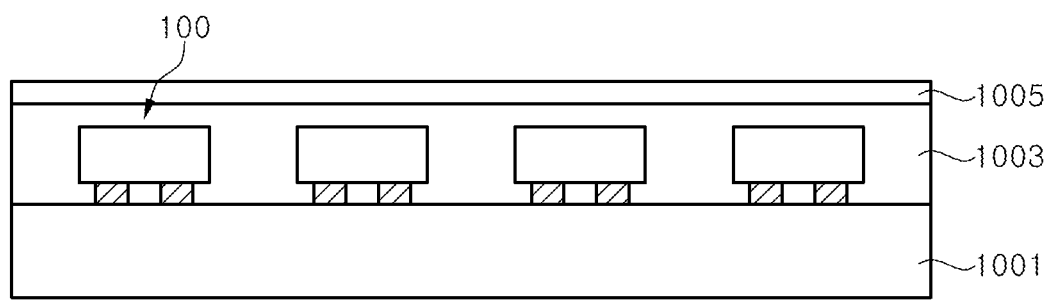
FIG. 2B is a schematic cross-sectional view taken along line B-B' of FIG. 2A.

FIG. 2A is a schematic plan view illustrating a light emitting module 1000 according to an exemplary embodiment, and FIG. 2B is a schematic cross-sectional view taken along line B-B' of FIG. 2A.

Referring to FIGS. 2A and 2B, the light emitting module 1000 may further includes a circuit board 1001, unit pixels 100 arranged on the circuit board 1001, and a molding member 1003 covering the unit pixels 100, and an anti-glare layer 1005.

The circuit board 1001 may have a circuit for electrically connecting a panel substrate 2100 and the unit pixels 100. The circuit in the circuit board 1001 may be formed in a multilayer structure. The circuit board 1001 may also include a passive circuit for driving the unit pixels 100 in a passive matrix driving manner or an active circuit for driving the unit pixels 100 in an active matrix driving manner. The circuit board 1001 may have pads exposed on a surface thereof, and the unit pixels 100 may be bonded to the pads of the circuit board 1001 through a bonding material.

The unit pixels 100 may be arranged on the circuit board 1001. The unit pixels 100 may be arranged in a 4×4 matrix as shown in FIG. 2A, but the inventive concepts are not limited thereto, and may be arranged in various matrices such as 2×2, 3×3, 5×5, or the like.

The unit pixels 100 are bonded to the circuit board 1001 through a bonding material. For example, the bonding material may be solder, and after a solder paste is disposed on the pads on the circuit board 1001 using a technology such as screen printing, the unit pixel 100 and the circuit board 1001 may be bonded through a reflow process. A specific configuration of the unit pixels 100 will be described in detail later with reference to FIGS. 3A and 3B.

The molding member 1003 covers the unit pixels 100. The molding member 1003 may contact the surface of the circuit board 1001 and may cover upper surfaces of the unit pixels 100. In addition, the molding member 1003 may have a flat upper surface. In particular, unlike a prior art, a concave portion is not formed on a region between the unit pixels 100.

The molding member 1003 may be formed using an ultraviolet-curable resin. Since the ultraviolet-curable resin is used, it is possible to increase hardness of the molding member 1003 compared to a thermosetting resin. The molding member 1003 may be formed of, for example, a dry-film type solder resist (DFSR), a photoimageable solder resist (PSR), a black material (BM), or the like. The molding member 1003 may improve contrast of the displaying apparatus 10000 by preventing optical interference between the unit pixels 100.

The anti-glare layer 1005 may cover the molding member 1003. The anti-glare layer 1005 prevents light reflection and relieves eye fatigue of a user. The anti-glare layer 1005 may be formed, for example, by coating a surface of the molding member 1003 after mixing fine particles such as silica, melamine, acryl, or the like with a curable resin into an ink, and may be cured using ultraviolet rays.

In the illustrated exemplary embodiment, the unit pixels 100 may be formed of the light emitting module 1000, and a plurality of light emitting modules 1000 may be mounted on the panel substrate 2100, thereby providing the displaying apparatus 10000, accordingly, a process yield of the displaying apparatus 10000 may be improved.

Figure 3B:
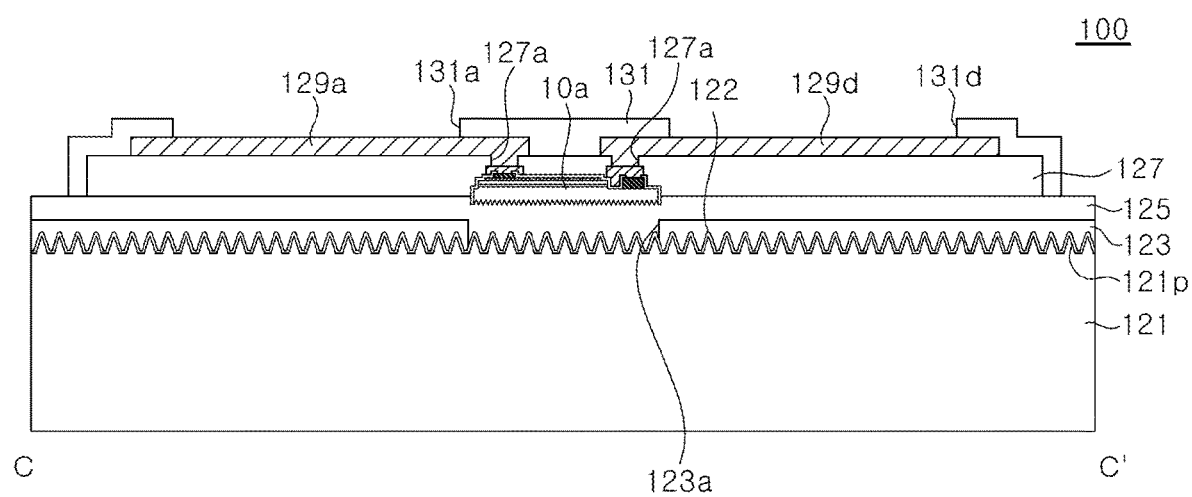
FIG. 3B is a schematic cross-sectional view taken along line C-C' of FIG. 3A.

FIG. 3A is a schematic plan view illustrating a unit pixel 100 according to an exemplary embodiment, FIG. 3B is a schematic cross-sectional view taken along line C-C' of FIG. 3A.

Referring to FIGS. 3A and 3B, the unit pixel 100 may include a transparent substrate 121, a first, a second, and a third light emitting devices 10a, 10b, and 10c, a surface layer 122, a light blocking layer 123, an adhesive layer 125, a step adjustment layer 127, connection layers 129a, 129b, 129c, and 129d, and an insulation material layer 131.

The unit pixel 100 provides a single pixel including the first, second, and third light emitting devices 10a, 10b, and 10c. The first, second, and third light emitting devices 10a, 10b, and 10c emit light of different colors, and the first, second, and third light emitting devices 10a, 10b, and 10c correspond to subpixels, respectively.

The transparent substrate 121 is a light transmissive substrate such as PET, glass substrate, quartz, sapphire substrate, or the like. The transparent substrate 121 is disposed on a light exiting surface of the light emitting module 1000, and light emitted from the light emitting devices 10a, 10b, and 10c is emitted to the outside through the transparent substrate 121. The transparent substrate 121 may have an upper surface and a lower surface. The transparent substrate 121 may include a concave-convex pattern 121p on a surface facing the light emitting devices 10a, 10b, and 10c, that is, the upper surface. The concave-convex pattern 121p scatters light emitted from the light emitting devices 10a, 10b, and 10c to increase a viewing angle. In addition, light emitted from the light emitting devices 10a, 10b, and 10c having different viewing angle characteristics from one another may be emitted at a uniform viewing angle by the concave-convex pattern 121p. As such, it is possible to prevent an occurrence of color difference depending on the viewing angle.

The concave-convex pattern 121p may be regular or irregular. The concave-convex pattern 121P may have a pitch of about 3 μm, a diameter of about 2.8 μm, and a height of about 1.8 μm, for example. The concave-convex pattern 121p may be a pattern generally applied to a patterned sapphire substrate, but the inventive concepts are not limited thereto.

The transparent substrate 121 may also include an anti-reflection coating, may include an anti-glare layer, or may be treated with an anti-glare treatment. The transparent substrate 121 may have a thickness of about 50 μm to about 300 μm for example.

Since the transparent substrate 121 is disposed on the light exiting surface, the transparent substrate 121 does not include a circuit. However, the inventive concepts are not limited thereto, and, in some exemplary embodiments, the transparent substrate 121 may include the circuit.

Although a single unit pixel 100 is illustrated to be formed on a single transparent substrate 121, a plurality of unit pixels 100 may be formed on the single transparent substrate 121.

The surface layer 122 covers the concave-convex pattern 121p of the transparent substrate 121. The surface layer 122 may be formed along a shape of the concave-convex pattern 121p. The surface layer 122 may improve adhesion of the light blocking layer 123 and the adhesive layer 125 formed thereon. For example, the surface layer 122 may be formed of a silicon oxide layer. The surface layer 122 may be omitted depending on a type of the transparent substrate 121.

The light blocking layer 123 is formed on the upper surface of the transparent substrate 121. The light blocking layer 123 may contact the surface layer 122. The light blocking layer 123 may include an absorbing material which absorbs light such as carbon black. The light absorbing material may prevent light generated in the light emitting devices 10a, 10b, and 10c from leaking from a region between the transparent substrate 121 and the light emitting devices 10a, 10b, and 10c toward a side surface thereof, and may improve contrast of the display apparatus.

The light blocking layer 123 may have windows 123a, 123b, and 123c for a light path, so that light generated in the light emitting devices 10a, 10b, and 10c is incident on the transparent substrate 121, and for this purpose, the light blocking layer 123 may be patterned to expose the transparent substrate 121 on the transparent substrate 121. Widths of the windows 123a, 123b, and 123c may be narrower than those of the light emitting devices, but the inventive concepts are not limited thereto, and may be greater than or equal to those of the light emitting devices.

The window 123a of the light blocking layer 123 also defines arrangement locations of the light emitting devices 10a, 10b, and 10c. Accordingly, separate arrangement markers for defining the arrangement locations of the light emitting devices 10a, 10b, and 10c may be omitted. However, the inventive concepts are not limited thereto, and the arrangement markers may be provided on the transparent substrate 121 or on the light blocking layer 123 or the adhesive layer 125 so as to provide the locations for arranging the light emitting devices 10a, 10b, and 10c.

The adhesive layer 125 is attached onto the transparent substrate 121. The adhesive layer 125 may cover the light blocking layer 123. The adhesive layer 125 may be attached onto an entire surface of the transparent substrate 121, but the inventive concepts are not limited thereto, and, in some exemplary embodiments, the adhesive layer 125 may be attached to a portion of the transparent substrate 121 to expose a region near an edge of the transparent substrate 121. The adhesive layer 125 is used to attach the light emitting devices 10a, 10b, and 10c to the transparent substrate 121. The adhesive layer 125 may fill the window 123a formed in the light blocking layer 123.

The adhesive layer 125 may be formed as a light-transmitting layer, and transmits light emitted from the light emitting devices 10a, 10b, and 10c. The adhesive layer 125 may be formed using an organic adhesive. For example, the adhesive layer 125 may be formed using a transparent epoxy. In addition, the adhesive layer 125 may include a diffuser such as $SiO_2$, $TiO_2$, ZnO, or the like to diffuse light. The light diffusing material prevents the light emitting devices 10a, 10b and 10c from being observed from the light exiting surface.

Meanwhile, the first, second, and third light emitting devices 10a, 10b, and 10c are disposed on the transparent substrate 121. The first, second, and third light emitting devices 10a, 10b, and 10c may be attached to the transparent substrate 121 by the adhesive layer 125. The first, second, and third light emitting devices 10a, 10b, and 10c may be disposed to correspond to the windows 123a, 123b, and 123c of the light blocking layer 123. When the light blocking layer 123 is omitted, arrangement markers may be added to provide arrangement locations of the light emitting devices 10a, 10b, and 10c.

The first, second, and third light emitting devices 10a, 10b, and 10c may be, for example, a red light emitting device, a green light emitting device, and a blue light emitting device. Each of the light emitting devices 10a, 10b, and 10c may have a major axis length of about 200 μm or less, further about 100 μm or less. Specific configurations of each of the first, second, and third light emitting devices 10a, 10b, and 10c will be described in detail later with reference to FIGS. 4A and 4B.

The first, second, and third light emitting devices 10a, 10b, and 10c may be arranged side by side in a line, as illustrated in FIG. 3A. In particular, in a case that the transparent substrate 121 is a sapphire substrate, the sapphire substrate may include clean-cut surfaces (e.g., m-plane) and non-clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut cleanly along the crystal plane, and two remaining cutting planes (e.g., a-plane) disposed in a direction perpendicular to the cutting planes may not be cut cleanly. In this case, the clean-cut surfaces of the sapphire substrate 121 may be flush with an arrangement direction of the light emitting devices 10a, 10b, and 10c. For example, in FIG. 4A, the clean-cut surfaces (e.g., m-plane) may be disposed up and down, and the two remaining cut surfaces (e.g., a-plane) may be disposed left and right.

The step adjustment layer 127 covers the first, second, and third light emitting devices 10a, 10b, and 10c. The step adjustment layer 127 has openings 127a exposing electrode pads of the light emitting devices 10a, 10b, and 10c. The step adjustment layer 127 assists to securely form the connection layers 129a, 129b, 129c, and 129d by uniformly adjusting elevations of surfaces on which the connection layers 129a, 129b, 129c, and 129d are formed. The step adjustment layer 127 may be formed of, for example, photosensitive polyimide.

The step adjustment layer 127 may be disposed in a region surrounded by an edge of the adhesive layer 125, but the inventive concepts are not limited thereto. For example, the step adjustment layer 127 may be formed to partially expose the edge of the adhesive layer 125, as shown in FIG. 3B.

The first, second, third, and fourth connection layers 129a, 129b, 129c, and 129d are formed on the step adjustment layer 127. The connection layers 129a, 129b, 129c, and 129d may be connected to the electrode pads of the first, second, and third light emitting devices 10a, 10b, and 10c through the openings 127a of the step adjustment layer 127.

In an exemplary embodiment, as illustrated in FIGS. 3A and 3B, the first connection layer 129a may be electrically connected to a second conductivity type semiconductor layer of the first light emitting device 10a, the second connection layer 129b may be electrically connected to a second conductivity of the second light emitting device 10b, the third connection layer 129c may be electrically connected to a second conductivity type semiconductor layer of the third light emitting device 10c, and the fourth connection layer 129d may be commonly electrically connected to first conductivity type semiconductor layers of the first, second, and third light emitting devices 10a, 10b, and 10c. The first, second, third, and fourth connection layers 129a, 129b, 129c, and 129d may be formed together on the step adjustment layer 127, and may have a single layer or multiple layers. For example, the first, second, third, and fourth connection layers 129a, 129b, 129c, and 129d may include at least one of Cr, Ti, Ni, Cu, Al, Pt, or Au.

In another exemplary embodiment, the first connection layer 129a may be electrically connected to the first conductivity type semiconductor layer of the first light emitting device 10a, the second connection layer 129b may be electrically connected to the first conductivity type semiconductor layer of the second light emitting device 10b, the third connection layer 129c may be electrically connected to the first conductivity type semiconductor layer of the third light emitting device 10c, and the fourth connection layer 129d may be commonly electrically connected to the second conductivity type semiconductor layers of the first, second, and third light emitting devices 10a, 10b, and 10c. The first, second, third, and fourth connection layers 129a, 129b, 129c, and 129d may be formed together on the step adjustment layer 127.

The insulation material layer 131 may be formed to have a thickness smaller than that of the step adjustment layer 127. A sum of the thicknesses of the insulation material layer 131 and the step adjustment layer 127 may be about 1 μm or more and 50 μm or less, but the inventive concepts are not limited thereto.

The insulation material layer 131 covers side surfaces of the step adjustment layer 127 and the connection layers 129a, 129b, 129c, and 129d. In addition, the insulation material layer 131 may cover a portion of the adhesive layer 125. The insulation material layer 131 may have openings 131a, 131b, 131c, and 131d exposing the connection layers 129a, 129b, 129c, and 129d, and accordingly, pad regions of the unit pixel 100 may be defined.

In an exemplary embodiment, the insulation material layer 131 may be a translucent material, and may be formed of an organic or inorganic material. The insulation material layer 131 may be formed of, for example, polyimide. When the insulation material layer 131 along with the step adjustment layer 127 is formed of polyimide, all of lower, side, and upper surfaces of the connection layers 129a, 129b, 129c, and 129d may be surrounded by the polyimide, except for the pad regions.

Meanwhile, the unit pixel 100 may be mounted on a circuit board using a bonding material such as solder, and the bonding material may bond the connection layers 129a, 129b, 129c, and 129d exposed to the openings 131a, 131b, 131c, and 131d of the insulation material layer 131 to pads on the circuit board.

According to the illustrated exemplary embodiment, the unit pixel 100 does not include separate bumps, and the connection layers 129a, 129b, 129c, and 129d are used as bonding pads. However, the inventive concepts are not limited thereto, and bonding pads covering the openings 131a, 131b, 131c, and 131d of the insulation material layer 131 may be formed. In an exemplary embodiment, the bonding pads may be formed to partially cover the light emitting devices 10a, 10b, and 10c outside of upper regions of the first, second, third, and fourth connection layers 129a, 129b, 129c, and 129d.

In the illustrated exemplary embodiment, the light emitting devices 10a, 10b, and 10c are described as being attached to the transparent substrate 121 by the adhesive layer 125, but the light emitting devices 10a, 10b, and 10c may be coupled to the transparent substrate 121 using another coupler instead of the adhesive layer 125. For example, the light emitting devices 10a, 10b, and 10c may be coupled to the transparent substrate 121 using spacers, and thus, gas or liquid may be filled in a region between the light emitting devices 10a, 10b, and 10c and the transparent substrate 121. An optical layer that transmits light emitted from the light emitting devices 10a, 10b, and 10c may be formed by the gas or liquid. The adhesive layer 125 described above is also an example of the optical layer. Herein, the optical layer is formed of a material such as gas, liquid, or solid, different from those of the light emitting devices 10a, 10b, and 10c, and thus, is distinguished from the materials of the semiconductor layers in the light emitting devices 10a, 10b, and 10c.

According to the illustrated exemplary embodiment, the unit pixel 100 in which the light emitting devices 10a, 10b, and 10c are arranged on the same plane is provided. The unit pixel 100 may implement light of various colors using the light emitting devices 10a, 10b, and 10c. Hereinafter, the light emitting devices 10a, 10b, and 10c according to an exemplary embodiment will be described in detail.

Figure 4A:
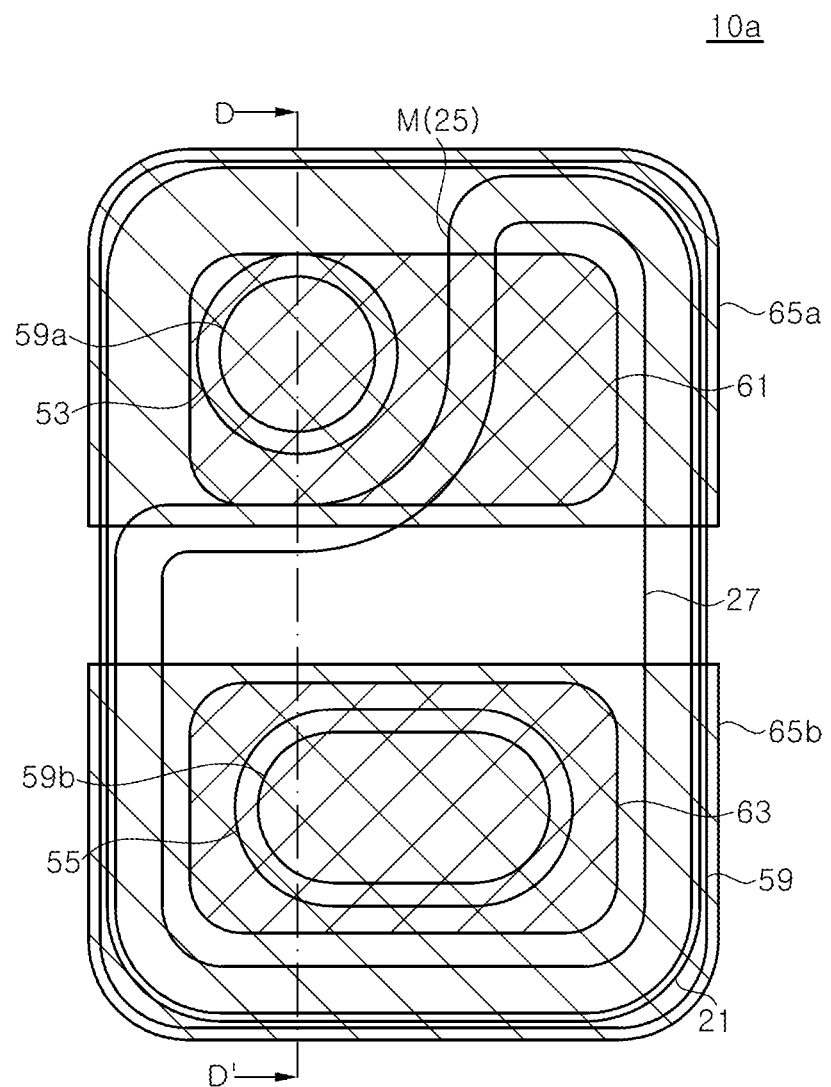
FIG. 4A is a schematic plan view illustrating a light emitting device according to an exemplary embodiment.
Figure 4B:
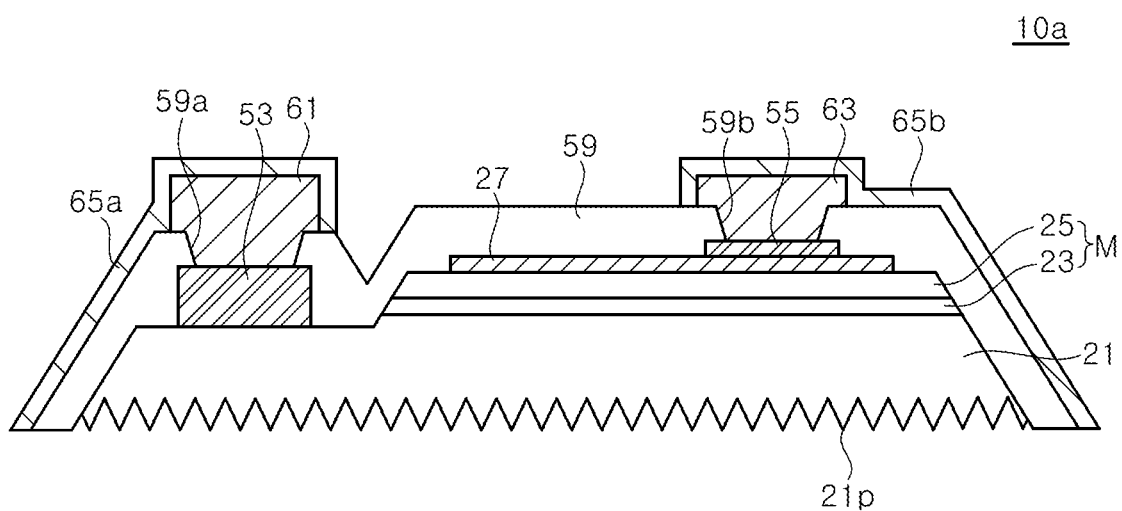
FIG. 4B is a schematic cross-sectional view taken along line D-D' of FIG. 4A.

FIG. 4A is a schematic plan view illustrating the light emitting device 10a according to an exemplary embodiment, and FIG. 4B is a schematic cross-sectional view taken along line D-D' of FIG. 4A. Herein, the light emitting device 10a is described as an example, but as the light emitting devices 10b and 10c have a substantially similar structure to that of the light emitting device 10a, repeated descriptions thereof will be omitted.

Referring to FIGS. 4A and 4B, the light emitting device 10a may include a light emitting structure including a first conductivity type semiconductor layer 21, an active layer 23, and a second conductivity type semiconductor layer 25, an ohmic contact layer 27, a first contact pad 53, a second contact pad 55, an insulation layer 59, a first electrode pad 61, a second electrode pad 63, a first metal reflection layer 65a, and a second metal reflection layer 65b.

The light emitting structure, that is, the first conductivity type semiconductor layer 21, the active layer 23, and the second conductivity type semiconductor layer 25 may be grown on a substrate. The substrate may be one of various substrates that are used to grow semiconductors, such as a gallium nitride substrate, a GaAs substrate, a Si substrate, a sapphire substrate, especially a patterned sapphire substrate. The growth substrate may be separated from the semiconductor layers using a process such as a mechanical grinding, a laser lift off, a chemical lift off process, or the like. However, the inventive concepts are not limited thereto, and, in some exemplary embodiments, a portion of the substrate may remain to constitute at least a portion of the first conductivity type semiconductor layer 21.

In an exemplary embodiment, in a case of the light emitting device 10a emitting red light, the semiconductor layers may include aluminum gallium arsenide (AlGaAs), gallium arsenide phosphide (GaAsP), aluminum gallium indium phosphide (AlGaInP), or gallium phosphide (GaP).

In a case of the light emitting device 10b emitting green light, the semiconductor layers may include indium gallium nitride (InGaN), gallium nitride (GaN), gallium phosphide (GaP), aluminum gallium indium phosphide (AlGaInP), or aluminum gallium phosphide (AlGaP).

In an exemplary embodiment, in a case of the light emitting device 10c emitting blue light, the semiconductor layers may include gallium nitride (GaN), indium gallium nitride (InGaN), or zinc selenide (ZnSe).

The first conductivity type and the second conductivity type have opposite polarities, such as when the first conductivity type is an n-type, the second conductivity type becomes a p-type, or, when the first conductivity type is a p-type, the second conductivity type becomes an n-type.

The first conductivity type semiconductor layer 21, the active layer 23, and the second conductivity type semiconductor layer 25 may be grown on the substrate in a chamber using a known process such as Metal Organic Chemical Vapor Deposition (MOCVD) process. In addition, the first conductivity type semiconductor layer 21 includes n-type impurities (e.g., Si, Ge, and Sn), and the second conductivity type semiconductor layer 25 includes p-type impurities (e.g., Mg, Sr, and Ba). In an exemplary embodiment, the first conductivity type semiconductor layer 21 may include GaN or AlGaN containing Si as a dopant, and the second conductivity type semiconductor layer 25 may include GaN or AlGaN containing Mg as a dopant.

Although the first conductivity type semiconductor layer 21 and the second conductivity type semiconductor layer 25 are shown as single layers in FIGS. 4A and 4B, these layers may be multiple layers, and may also include a superlattice layer. The active layer 23 may include a single quantum well structure or a multiple quantum well structure, and a composition ratio of a Nitride-based semiconductor may be adjusted to emit a desired wavelength. For example, the active layer 23 may emit blue light, green light, red light, or ultraviolet light.

The second conductivity type semiconductor layer 25 and the active layer 23 may have a mesa M structure and may be disposed on the first conductivity type semiconductor layer 21. The mesa M may include the second conductivity type semiconductor layer 25 and the active layer 23, and may include a portion of the first conductivity type semiconductor layer 21 as shown in FIG. 4B. The mesa M is located on a partial region of the first conductivity type semiconductor layer 21, and a upper surface of the first conductivity type semiconductor layer 21 may be exposed around the mesa M.

In the illustrated exemplary embodiment, the mesa M is formed so as to expose the first conductivity type semiconductor layer 21 around it. In another exemplary embodiment, a through hole may be formed through the mesa M to expose the first conductivity type semiconductor layer 21.

Meanwhile, the first conductivity type semiconductor layer 21 may have a concave-convex pattern 21p by surface texturing. The concave-convex pattern 21p may be formed on a light exiting surface of the first conductivity type semiconductor layer 21. Surface texturing may be carried out by patterning, for example, using a dry or wet etching process.

In an exemplary embodiment, cone-shaped protrusions may be formed, a height of the cone may be about 2 μm to about 3 μm, a distance between the cones may be about 1.5 μm to about 2 μm, and a diameter of a bottom of the cone may be about 3 μm to about 5 μm. The cone may also be truncated, in which an upper diameter of the cone may be about 2 μm to about 3 μm.

In another exemplary embodiment, the concave-convex pattern 21p may include a first concave-convex pattern and a second concave-convex pattern additionally formed on the first concave-convex pattern. The second concave-convex pattern may be formed to have a finer size than that of the first concave-convex pattern.

Since the concave-convex pattern is formed on the surface of the first conductivity type semiconductor layer 21, total internal reflection may be reduced, thereby increasing light extraction efficiency. Surface texturing may be carried out on the first conductivity type semiconductor layers of all of the first, second, and third light emitting devices 10a, 10b, and 10c, and thus, viewing angles of light emitted from the first, second, and third light emitting devices 10a, 10b, and 10c may become uniform. However, the inventive concepts are not limited thereto, and some of the light emitting devices may have a flat surface without including the concave-convex pattern 21p.

At least one on the first conductivity type semiconductor layers 21 of the light emitting devices 10a, 10b, and 10c may have inclined side surfaces. The inclined side surfaces may be formed by a device isolation process. An inclination angle of the side surface of the first conductivity type semiconductor layer 21 may be in the range of about 40 to about 80 degrees with respect to the bottom surface of the first conductivity type semiconductor layers 21. The mesa M may also have inclined side surfaces, and may be in the range of about 40 to about 80 degrees with respect to the bottom surface of the mesa M. Owing to the inclined side surfaces of the first conductivity type semiconductor layer 21 and the mesa M, metal reflection layers 65a and 65b may be easily formed thereon, which will be described in detail later.

The ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide film or a metal film. For example, the transparent conductive oxide film may include ITO, ZnO, or the like, and the metal film may include a metal such as Al, Ti, Cr, Ni, Au, or the like and alloys thereof.

The first contact pad 53 is disposed on the exposed first conductivity type semiconductor layer 21. The first contact pad 53 may be in ohmic contact with the first conductivity type semiconductor layer 21. For example, the first contact pad 53 may be formed of an ohmic metal layer in ohmic contact with the first conductivity type semiconductor layer 21. The ohmic metal layer of the first contact pad 53 may be appropriately selected depending on a semiconductor material of the first conductivity type semiconductor layer 21. The first contact pad 53 may be omitted.

The second contact pad 55 may be disposed on the ohmic contact layer 27. The second contact pad 55 is electrically connected to the ohmic contact layer 27. The second contact pad 55 may be omitted.

The insulation layer 59 covers the mesa M, the ohmic contact layer 27, the first contact pad 53, and the second contact pad 55. The insulation layer 59 has openings 59a and 59b exposing the first contact pad 53 and the second contact pad 55. The insulation layer 59 may include a distributed Bragg reflector in which insulation layers having different refractive indices from one another are stacked. For example, the distributed Bragg reflector may include at least two types of insulation layers selected from $SiO_2$, $Si_3N_4$, SiON, $TiO_2$, $Ta_2O_5$, $Nb_2O_5$, $MgF_2$, etc.

The distributed Bragg reflector may include, for example, a plurality of pairs of low refractive index layers and high refractive index layers. For example, the distributed Bragg reflector may include, for example, ten (10) or more pairs of low and high refractive index layers.

The distributed Bragg reflector reflects light emitted from the active layer 23. The distributed Bragg reflector may exhibit high reflectance over a relatively wide wavelength range including a peak wavelength of light emitted from the active layer 23, and may be designed in consideration of an incident angle of light. In an exemplary embodiment, the distributed Bragg reflector may have a higher reflectance for light incident at an incident angle of 0 degrees than that for light incident at a different incident angle. In another exemplary embodiment, the distributed Bragg reflector may have a higher reflectance for light incident at a particular incident angle than that for light incident at the incident angle of 0 degrees. For example, the distributed Bragg reflector may have a higher reflectance for light incident at an incident angle of 10 degrees than thar for light incident at the incident angle of 0 degrees.

Meanwhile, the light emitting structure of the blue light emitting device 10c has higher internal quantum efficiency compared to those of the light emitting structures of the red light emitting device 10a and the green light emitting device 10b. Accordingly, the blue light emitting device 10c may exhibit higher light extraction efficiency than those of the red and green light emitting devices 10a and 10b. As such, it may be difficult to properly maintain a color mixing ratio of red light, green light, and blue light.

To adjust the color mixing ratio of red light, green light, and blue light, the distributed Bragg reflectors applied to the light emitting devices 10a, 10b, and 10c may be formed to have different reflectance from one another. For example, the blue light emitting device 10c may have the distributed Bragg reflector having a relatively low reflectance compared to those of the red and green light emitting devices 10a and 10c. For example, the distributed Bragg reflector formed in the blue light emitting device 10c may have a reflectance of 95% or less at the incident angle of 0 degrees for blue light generated in the active layer 23, and further 90% or less, the distributed Bragg reflector formed in the green light emitting device 10b may have a reflectance of about 95% or more and 99% or less at the incident angle of 0 degrees for green light, and the distributed Bragg reflector formed in the red light emitting device 10a may have a reflectance of 99% or more at the incident angle of 0 degrees for red light.

In an exemplary embodiment, the distributed Bragg reflectors applied to the red, green, and blue light emitting devices 10a, 10b, and 10c may have a substantially similar thickness. For example, a difference in thickness between the distributed Bragg reflectors applied to these light emitting devices 10a, 10b, and 10c may be 10% or less of a thickness of a thickest distributed Bragg reflector. By reducing the thickness difference between the distributed Bragg reflectors, process conditions applied to the red, green, and blue light emitting devices 10a, 10b, and 10c, for example, a process of patterning the insulation layer 59, may be similarly set, and furthermore, it is possible to prevent the unit pixel manufacturing process from becoming complex. Moreover, the distributed Bragg reflectors applied to the red, green, and blue light emitting devices 10a, 10b, and 10c may have a substantially similar stacking number. However, the inventive concepts are not limited thereto.

The first electrode pad 61 and the second electrode pad 63 are disposed on the insulation layer 59. As shown in FIG. 4A, the first electrode pad 61 may extend from an upper region of the first contact pad 53 to an upper region of the mesa M, and the second electrode pad 63 may be disposed in the upper region of the mesa M. The first electrode pad 61 may be connected to the first contact pad 53 through the opening 59a, and the second electrode pad 63 may be electrically connected to the second contact pad 55. The first electrode pad 61 may be directly in ohmic contact with the first conductivity type semiconductor layer 21, and in this case, the first contact pad 53 may be omitted. In addition, when the second contact pad 55 is omitted, the second electrode pad 63 may be directly connected to the ohmic contact layer 27.

The first and/or second electrode pads 61 and 63 may be formed of a single layer or a multilayer metal. As a material of the first and/or second electrode pads 61 and 63, metals such as Al, Ti, Cr, Ni, Au, or the like and alloys thereof may be used.

Meanwhile, when the low refractive index layers and the high refractive index layers are alternately stacked one above another, a thickness of the insulation layer 59 formed on a side surface of the mesa M and a side surface of the first conductivity type semiconductor layer 21 may be smaller than that of the insulation layer 59 formed over the second conductivity type semiconductor layer 25. That is, the insulation layer 59 formed on a side surface of the light emitting device 10a is relatively thinner than the insulation layer 59 formed on an upper surface thereof. In particular, when the insulation layer 59 includes the distributed Bragg reflector, the distributed Bragg reflector with a well-controlled optical thickness may be formed on the upper surface of the light emitting device 10a, but it is difficult to form the distributed Bragg reflector with the well-controlled optical thicknesses on the side surface of the light emitting device 10a. Accordingly, the insulation layer 59 formed on the side surface of the light emitting device 10a and the insulation layer 59 formed on the upper surface thereof exhibit different reflectances from each other, and light leakage may occur through the side surface of the light emitting device 10a.

Light leakage through the insulation layer 59 on the side of the light emitting device 10a may be prevented by using the first and second metal reflection layers 65a and 65b. The first and second metal reflection layers 65a and 65b may form an omni-directional reflector together with the insulation layer 59, and thus they may improve light efficiency into a light emission direction, in addition to preventing light leakage. The first metal reflection layer 65a may cover the first electrode pad 61, and may cover the side surface of the light emitting device 10a around the first electrode pad 61. As shown in FIG. 4A, the first metal reflection layer 65a may cover the first electrode pad 61, and furthermore, may cover side surfaces of the first conductivity type semiconductor layer 21, the active layer 23, and the second conductivity type semiconductor 25. In addition, the second metal reflection layer 65b may cover the second electrode pad 63, and may cover the side surface of the light emitting device 10a around the second electrode pad 63. Furthermore, the first electrode pad 61 may cover a portion of a side surface of the mesa M, in particular, a side surface of the mesa M located between the first electrode pad 61 and the mesa M. As shown in FIG. 4A, the second metal reflection layer 65b may cover the second electrode pad 63, and may cover the side surfaces of the first conductivity type semiconductor layer 21, the active layer 23, and the second conductivity type semiconductor layer 25.

The first metal reflection layer 65a and the second metal reflection layer 65b are spaced apart from each other to prevent an electrical short. A separation distance between the first metal reflection layer 65a and the second metal reflection layer 65b may be closer than a separation distance between the first electrode pad 61 and the second electrode pad 63, but the inventive concepts are not limited thereto. The first metal reflection layer 65a and the second metal reflection layer 65b may include Cr, Ni, Al, Pt, Ag, or Au.

Although the light emitting device 10a according to the exemplary embodiment has been briefly described with reference to FIGS. 4A and 4B, the light emitting device 10a may further include a layer having additional functions in addition to the above-described layers. For example, various layers such as an additional insulation layer for insulating a specific element, and a solder preventing layer for preventing diffusion of solder may be further included.

When a flip chip type light emitting device is formed, the mesa may be formed to have various shapes, and locations and shapes of the first and second electrode pads 61 and 63 may also be variously modified, and the second contact pad 55 or the second electrode pad 63 may directly contact the second conductivity type semiconductor layer 25.

In the illustrated exemplary embodiment, the first, second, and third light emitting devices 10a, 10b, and 10c are exemplarily described as the flip chip structure, but the inventive concepts are not limited thereto, and a light emitting device of a lateral structure may be included.

Figure 5A:
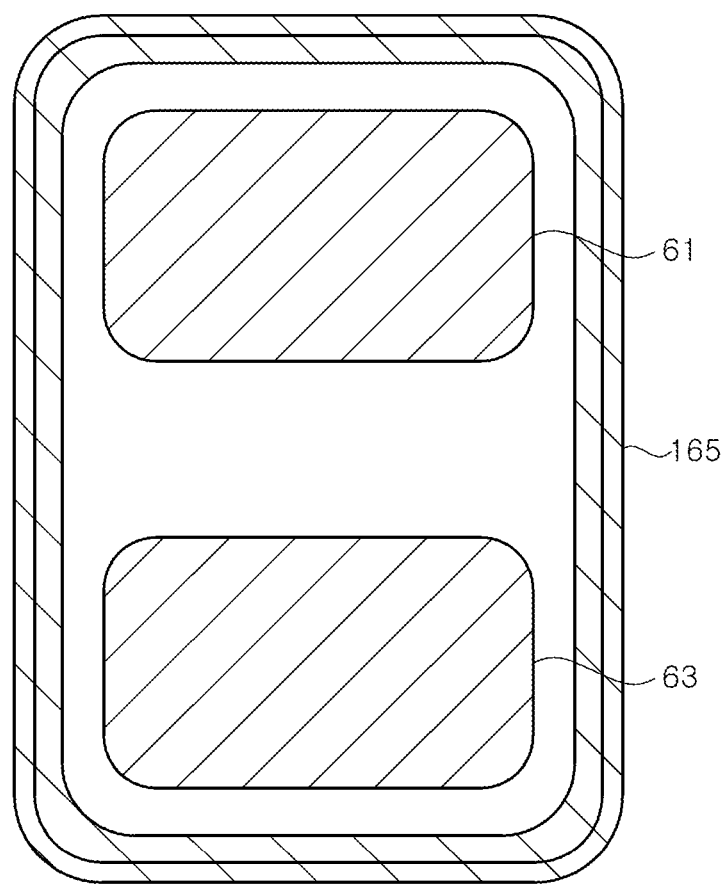
FIG. 5A is a schematic plan view illustrating a light emitting device according to another exemplary embodiment.

FIG. 5A is a schematic plan view illustrating a light emitting device according to another exemplary embodiment.

Referring to FIG. 5A, the light emitting device according to the illustrated exemplary embodiment is substantially similar to the light emitting device 10a described above except for a shape of a metal reflection layer 165.

In the illustrated exemplary embodiment, the metal reflection layer 165 is arranged in a ring shape along a side surface of the light emitting device, and spaced apart from first and second electrode pads 61 and 63. The metal reflection layer 165 covers side surfaces of a first conductivity type semiconductor layer 21, an active layer 23, and a second conductivity type semiconductor layer 25.

According to the illustrated exemplary embodiment, the metal reflection layer 165 may cover entire side surfaces of the light emitting device, thereby further preventing light leakage through the side surface of the light emitting device. Furthermore, since the metal reflection layer 165 is spaced apart from the first and second electrode pads 61 and 63, it is possible to provide an electrically stable micro LED.

Figure 5B:
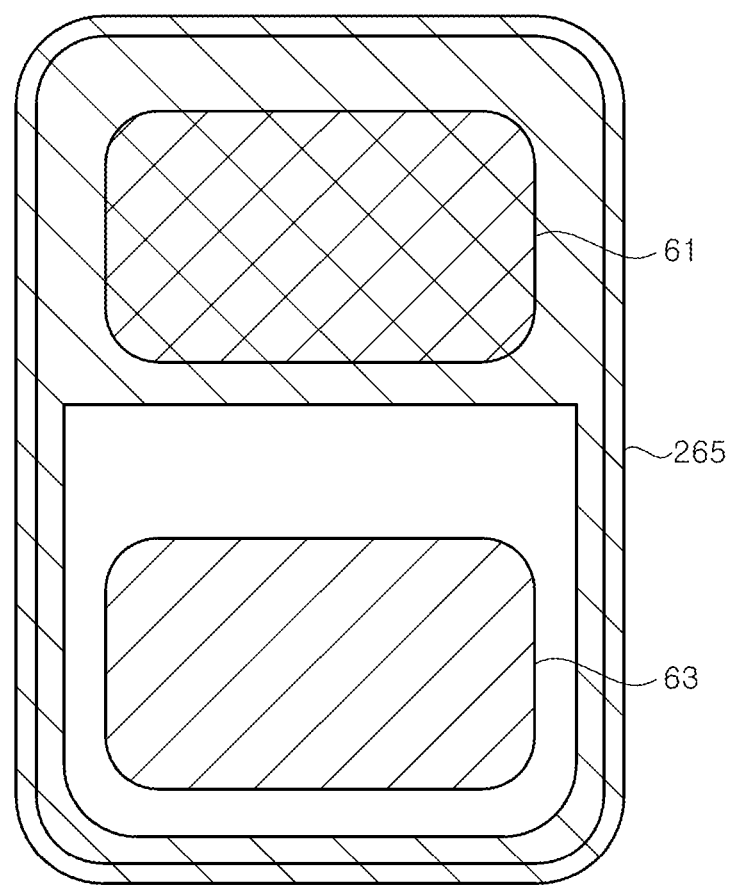
FIG. 5B is a schematic plan view illustrating a light emitting device according to another exemplary embodiment.

FIG. 5B is a schematic plan view illustrating a light emitting device according to another exemplary embodiment.

Referring to FIG. 5B, the light emitting device according to the illustrated exemplary embodiment is substantially similar to the light emitting device described with reference to FIG. 5A except that a metal reflection layer 265 covers a first electrode pad 61. As shown in FIG. 5B, the second electrode pad 63 is surrounded by a white space which separates the second electrode 63 from the metal reflection layer 265. The second electrode pad 63 is spaced apart from the metal reflection layer 265 and the first electrode pad 61 is covered by the metal reflection layer 265.

The metal reflection layer 265 may cover side surfaces of a first conductivity type semiconductor layer 21, an active layer 23, and a second conductivity type semiconductor layer 25 along a side surface of the light emitting device, and further, may at least partially cover the electrode pad 61. In addition, the metal reflection layer 265 may cover a side surface of a mesa M located between the first electrode pad 61 and the mesa M. Accordingly, light leakage of the light emitting device may be further prevented.

Alternatively, the metal reflection layer 265 may cover a second electrode pad 63 instead of the first electrode pad 61. However, since a thickness of the first conductivity type semiconductor layer 21 is larger than those of the active layer 23 and the second conductivity type semiconductor layer 25, when a defect such as a pinhole occurs in an insulation layer 59, the metal reflection layer 265 may be short-circuited to the first conductivity type semiconductor layer 21 on the side surface of the light emitting device. Accordingly, it is possible to provide an electrically safe light emitting device by electrically connecting the metal reflection layer 265 to the first electrode pad 61.

Figure 6A:
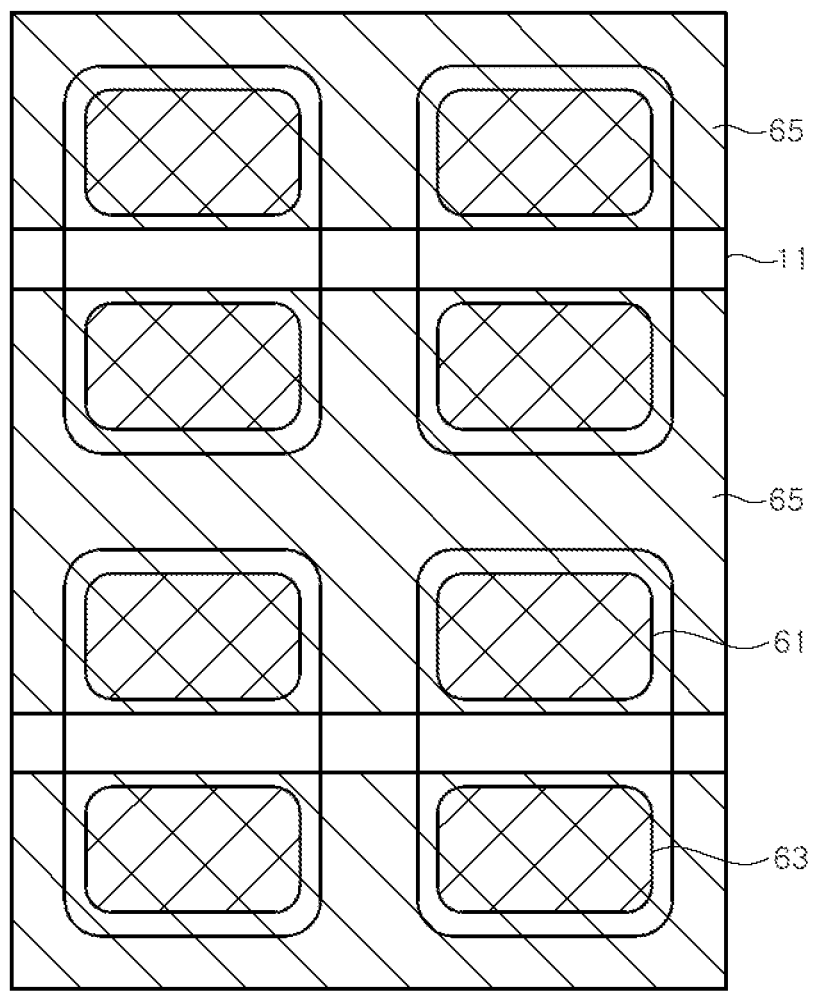
FIG. 6A is a schematic plan view illustrating a method of forming a metal reflection layer according to one exemplary embodiment.
Figure 6B:
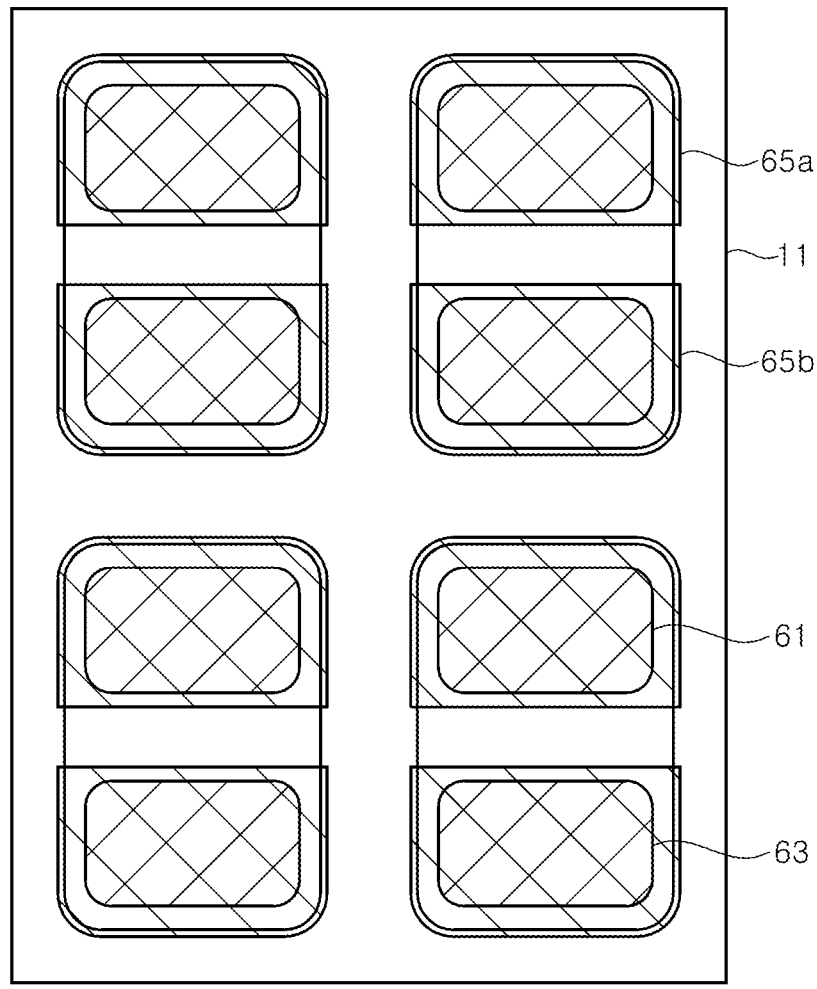
FIG. 6B is a schematic plan view illustrating a method of forming a metal reflection layer according to another exemplary embodiment

FIGS. 6A and 6B are schematic plan views illustrating a method of forming a first and a second metal reflection layers 65a and 65b.

First, light emitting devices in which a first electrode pad 61 and a second electrode pad 63 are formed are arranged on a substrate 11. The substrate 11 may be a growth substrate for growing a first conductivity type semiconductor layer 21, an active layer 23, and a second conductivity type semiconductor layer 25, and may be a temporary substrate on which light emitting devices on which the first electrode pad 61 and the second electrode pad 63 are formed are separated from a growth substrate and attached thereto.

Subsequently, metal reflection layers 65 covering the light emitting devices are formed. The metal reflection layers 65 may be formed parallel to one another using a lift-off technique.

The metal reflection layers 65 may be formed of a single layer or multiple layers of a metal material that reflects light, for example, Ni, Cr, Pt, Al, Ag, Au, or the like, and may be formed to have a thickness of, for example, about 100 nm.

Referring to FIG. 6B, subsequently, the first metal reflection layer 65a and the second metal reflection layer 65b may be formed on each of the light emitting devices by removing the metal reflection layers 65 around the light emitting devices using photolithography and etching techniques.

According to the illustrated exemplary embodiment, the first and second metal reflection layers 65a and 65b may be safely formed on the light emitting devices arranged at a narrow interval.

In the above exemplary embodiment, it has been described that the metal reflection layers 65a and 65b are formed in a two-step process using the lift-off technique and the etching technique together, but the metal reflection layers 65a and 65b may be formed in a single process using the lift-off technique or the photolithography and etching techniques.

Although some exemplary embodiments have been described herein, it should be understood that these exemplary embodiments are provided for illustration only and are not to be construed in any way as limiting the present disclosure. It should be understood that features or components of one exemplary embodiment can also be applied to other exemplary embodiments without departing from the spirit and scope of the present disclosure.

The invention claimed is:

1. A micro-scale light emitting device, comprising:
a semiconductor stack including a first conductivity type semiconductor layer, a second conductivity type semiconductor layer, and an active layer disposed between the first conductivity type semiconductor layer and the second conductivity type semiconductor layer,
wherein the first conductivity type semiconductor layer, the active layer and the second conductivity type semiconductor layer are laminated in a first direction;
an insulation layer extending in a second direction perpendicular to the first direction and covering an upper surface and one or more side surfaces of the semiconductor stack, wherein the upper surface is adjacent to the second conductivity type semiconductor layer in the first direction and the one or more side surfaces extend in the first direction toward the first conductivity type semiconductor layer;

a first electrode pad and a second electrode pad disposed on the insulation layer, and electrically connected to the first conductivity type semiconductor layer and the second conductivity type semiconductor layer, respectively; and
a reflection layer disposed on only an outer region of the insulation layer spaced apart from the first electrode pad and the second electrode pad in the second direction and covering an entirety of each side surface of the semiconductor stack,
wherein the insulation layer includes a distributed Bragg reflector; and
the micro-scale light emitting device is a sub-pixel of a unit pixel.

2. The micro-scale light emitting device of claim 1, wherein a thickness of the insulation layer covering the upper surface of the semiconductor stack is greater than that of the insulation layer covering the side surface of the semiconductor stack.

3. The micro-scale light emitting device of claim 2, wherein the insulation layer covering the upper surface of the semiconductor stack has a reflectance higher than that of the insulation layer covering the side surface of the semiconductor stack.

4. The micro-scale light emitting device of claim 1, wherein the insulation layer covers an entirety of each side surface of the semiconductor stack.

5. The micro-scale light emitting device of claim 1, wherein the insulation layer at least partially covers the first electrode pad and/or the second electrode pad.

6. The micro-scale light emitting device of claim 1, wherein the first electrode pad or the second electrode pad directly contacts the first conductivity type semiconductor layer or the second conductivity type semiconductor layer, respectively.

7. The micro-scale light emitting device of claim 1, wherein the reflection layer comprises a metal.

8. The micro-scale light emitting device of claim 1, wherein the reflection layer is arranged in a ring shape along side surfaces of the light emitting device.

9. The micro-scale light emitting device of claim 6, wherein:
the semiconductor stack further includes a mesa disposed on the first conductivity type semiconductor layer,
the mesa includes the active layer and the second conductivity type semiconductor layer,
a portion of the first electrode pad is extended to an upper region of the mesa, and
the second electrode pad is located on the mesa.

10. The micro-scale light emitting device of claim 9, further comprising:
a first contact pad adjacent to the mesa and disposed on the first conductivity type semiconductor layer,
wherein the first electrode pad is electrically connected to the first contact pad through a first opening formed in the insulation layer.

11. The micro-scale light emitting device of claim 6, further comprising:
an ohmic contact layer disposed on the second conductivity type semiconductor layer; and
a second contact pad disposed on the ohmic contact layer, wherein the second electrode pad is electrically connected to the second contact pad through a second opening formed in the insulation layer.

12. A micro-scale light emitting device, comprising:
a semiconductor stack including a first conductivity type semiconductor layer, an active layer disposed on the first conductivity type semiconductor layer, and a second conductivity type semiconductor layer disposed on the active layer,
the semiconductor stack further including a first surface and one or more second surfaces extending from the first surface and disposed at opposite ends;
an insulation layer covering the first surface and the one or more second surfaces of the semiconductor stack;
a first electrode pad and a second electrode pad disposed on the insulation layer, and electrically connected to the first conductivity type semiconductor layer and the second conductivity type semiconductor layer, respectively; and
a reflection layer disposed on only an outer region of the insulation layer laterally spaced apart from the first electrode pad and the second electrode pad, and covering an entirety of each of the second surfaces of the semiconductor stack, wherein:
the insulation layer disposed on the first surface of the semiconductor stack is thicker than the insulation layer disposed on the region of the one or more second surfaces of the semiconductor stack; and
the micro-scale light emitting device is a sub-pixel of a unit pixel.

13. The micro-scale light emitting device of claim 12, wherein the insulation layer disposed on the first surface of the semiconductor stack has a reflectance higher than that of the insulation layer disposed on the region of the one or more second surfaces of the semiconductor stack.

14. The micro-scale light emitting device of claim 12, wherein the insulation layer covers an entirety of each side surface of the semiconductor stack.

15. The micro-scale light emitting device of claim 12, wherein the insulation layer at least partially covers the first electrode pad and/or the second electrode pad.

16. The micro-scale light emitting device of claim 12, wherein the reflection layer comprises metal.

17. A unit pixel, comprising:
a transparent substrate;
a light blocking layer disposed on the transparent substrate and having windows that transmit light; and
a plurality of light emitting devices disposed on the light blocking layer to be arranged with the windows,
each of the light emitting devices structured to be a sub-pixel of the unit pixel and configured to be micro-scale, each light emitting device comprising:
a semiconductor stack including a first conductivity type semiconductor layer, a second conductivity type semiconductor layer, and an active layer disposed between the first conductivity type semiconductor layer and the second conductivity type semiconductor layer;
wherein the first conductivity type semiconductor layer, the active layer and the second conductivity type semiconductor layer are laminated in a first direction;
an insulation layer extending in a second direction perpendicular to the first direction and covering an upper surface and one or more side surfaces of the semiconductor stack, wherein the upper surface is adjacent to the second conductivity type semiconductor layer in the first direction and the one or more side surfaces extend in the first direction toward the first conductivity type semiconductor layer;
a first electrode pad and a second electrode pad disposed on the insulation layer, and electrically connected to the first conductivity type semiconductor layer and the second conductivity type semiconductor layer, respectively; and a reflection layer disposed on only an outer region of the insulation layer spaced apart from the first electrode pad and the second electrode pad in the second direction, and covering an entirety of each side surface of the semiconductor stack, wherein the insulation layer includes a distributed Bragg reflector.

18. The unit pixel of claim 17, wherein the insulation layers for at least two of the light emitting devices have different reflectances from each other.

19. A displaying apparatus, comprising:
a circuit board;
one or more unit pixels mounted on the circuit board, wherein said one or more unit pixels comprise the unit pixel of claim 17; and
a molding member covering the one or more unit pixels.

20. The unit pixel of claim 17, wherein the reflection layer comprises metal.

* * * * *